(12) United States Patent
Gurtner et al.

(10) Patent No.: US 10,613,147 B2
(45) Date of Patent: Apr. 7, 2020

(54) CURRENT SHUNT FOR MEASURING BATTERY CURRENT

(71) Applicant: K2 Energy Solutions, Inc., Henderson, NV (US)

(72) Inventors: David Gurtner, Las Vegas, NV (US); Kye Stoker, Henderson, NV (US); Scott Stewart, Henderson, NV (US)

(73) Assignee: K2 Energy Solutions, Inc., Henderson, NV (US)

( * ) Notice: Subject to any disclaimer, the term of this patent is extended or adjusted under 35 U.S.C. 154(b) by 145 days.

(21) Appl. No.: 15/718,929

(22) Filed: Sep. 28, 2017

(65) Prior Publication Data

US 2018/0238970 A1 Aug. 23, 2018

Related U.S. Application Data

(60) Provisional application No. 62/462,860, filed on Feb. 23, 2017.

(51) Int. Cl.

| | |
|---|---|
| *H01M 10/42* | (2006.01) |
| *H01M 10/0525* | (2010.01) |
| *H01M 10/48* | (2006.01) |
| *G01R 31/364* | (2019.01) |
| *H01M 2/20* | (2006.01) |
| *H01M 10/6551* | (2014.01) |
| *H01M 2/34* | (2006.01) |
| *G01R 1/20* | (2006.01) |

(52) U.S. Cl.
CPC .......... *G01R 31/364* (2019.01); *G01R 1/203* (2013.01); *H01M 2/202* (2013.01); *H01M 2/348* (2013.01); *H01M 10/0525* (2013.01); *H01M 10/425* (2013.01); *H01M 10/486* (2013.01); *H01M 10/6551* (2015.04); *H01M 2010/4271* (2013.01)

(58) Field of Classification Search
None
See application file for complete search history.

(56) References Cited

U.S. PATENT DOCUMENTS

| | | | | |
|---|---|---|---|---|
| 6,304,062 B1 * | 10/2001 | Batson | ................... | G01R 1/203 |
| | | | | 320/134 |
| 8,350,529 B2 * | 1/2013 | Loncarevic | ........... | H02J 7/0016 |
| | | | | 320/122 |

OTHER PUBLICATIONS

Acton, Ashton; Alloys-Advances in Research and Application; 2013; pp. 704-705 (Year: 2013).*
PDF Catalog Sheet of Riedon Inc., RSN Series DC Ammeter Shunt.
PDF Catalog Sheet of Riedon Inc., RSN 150-50B Shunt.

* cited by examiner

*Primary Examiner* — Sarah A. Slifka
(74) *Attorney, Agent, or Firm* — Stine Law Ltd.

(57) ABSTRACT

For a lithium-ion battery pack adapted to provide electrical power to a load via a conductor, a current shunt adapted to be disposed in series with the conductor is disclosed. The current shunt comprises one or more stacked leaves of an electrically conductive material such as nickel.

18 Claims, 7 Drawing Sheets

US 10,613,147 B2

CURRENT SHUNT FOR MEASURING BATTERY CURRENT

FIELD OF THE INVENTION

The present invention relates to a current shunt, such as for facilitating measurement of battery current.

BACKGROUND

A current shunt may be used to measure current flow in a circuit. The current to be measured may flow through a series-connected current shunt of known resistance, and the voltage across the shunt may be measured. Utilizing Ohm's Law (I=V/R), one may calculate the current based upon the measured voltage and the known resistance.

A battery system including a battery management system (BMS) in combination with a battery may utilize the current shunt to determine the current flowing in to, and out of, the battery. The BMS may use this information for such purposes such as to determine such criteria as the charge level, or state of charge, of the battery.

Particularly in the case of a system with high currents, it is desirable to minimize the resistance of the shunt as low as possible in order to minimize energy loss in the system. For example a resistance below 70 μΩ's (micro-Ohms) might be acceptable for a system expected to have 1000 Amps of current flow, as this would result in a voltage of 70 μΩ's times 1000 Amps, which equals 0.07 Volts. Power loss associated with this would be 1000 Amps times 0.07 Volts, which equals 70 Watts. Lower power loss would of course be better, but a minimum amount of resistance is necessary to provide a usefully measurable voltage.

Current shunts may be made of a conductive material such as a conductive metal or metal alloy. The resistance of many conductive materials may vary with temperature. For the current calculation to be sufficiently accurate over a range of temperatures, the resistance of the conductive material should be relatively constant over the range of temperatures.

One such conductive material having a relatively constant temperature coefficient of resistance, and which has been used in current shunts, is a copper-nickel alloy known as "constantan." Constantan typically consists of 55% copper and 45% nickel. However constantan may be a relatively expensive material. And the expense of constantan may become progressively more significant in high current applications, as progressively more constantan may be required to carry the high current.

SUMMARY

It is an object to provide a current shunt formed of a plurality of parallel leaves of nickel arranged as a set, which shunt may be used in conjunction with a lithium-ion battery coupled to a battery management system. The current shunt may provide a substantially constant temperature coefficient of resistance over the useful temperature range of the battery, which may be in the range of −15° C.-+60° C. (+5° F.-+140° F.).

BRIEF DESCRIPTION OF THE DRAWINGS

For a more complete understanding of the disclosure, reference should be made to the following detailed description and accompanying drawings, wherein.

DESCRIPTION OF THE PREFERRED EMBODIMENT

It is to be understood that this disclosure is not intended to limit the invention to any particular form described, but to the contrary, the invention is intended to include all modifications, alternatives and equivalents falling within the spirit and scope of the invention as defined by the appended claims.

Figure 1:
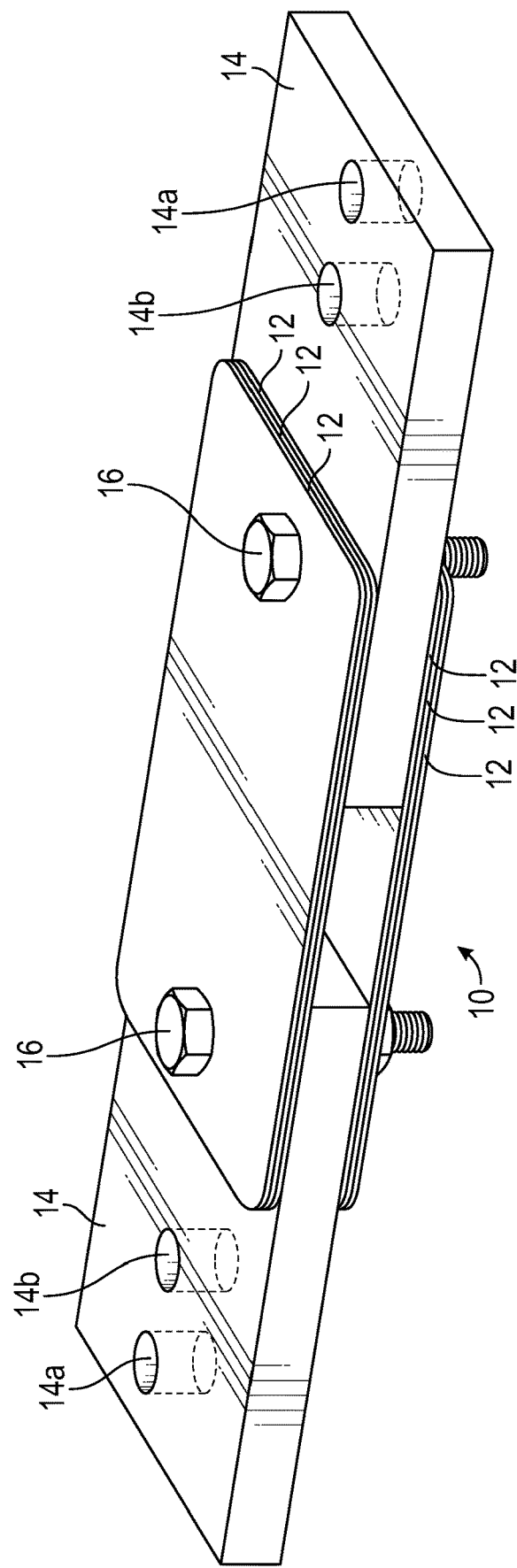
FIG. 1 is a perspective view of a current shunt in accordance with the present invention.
Figure 2:
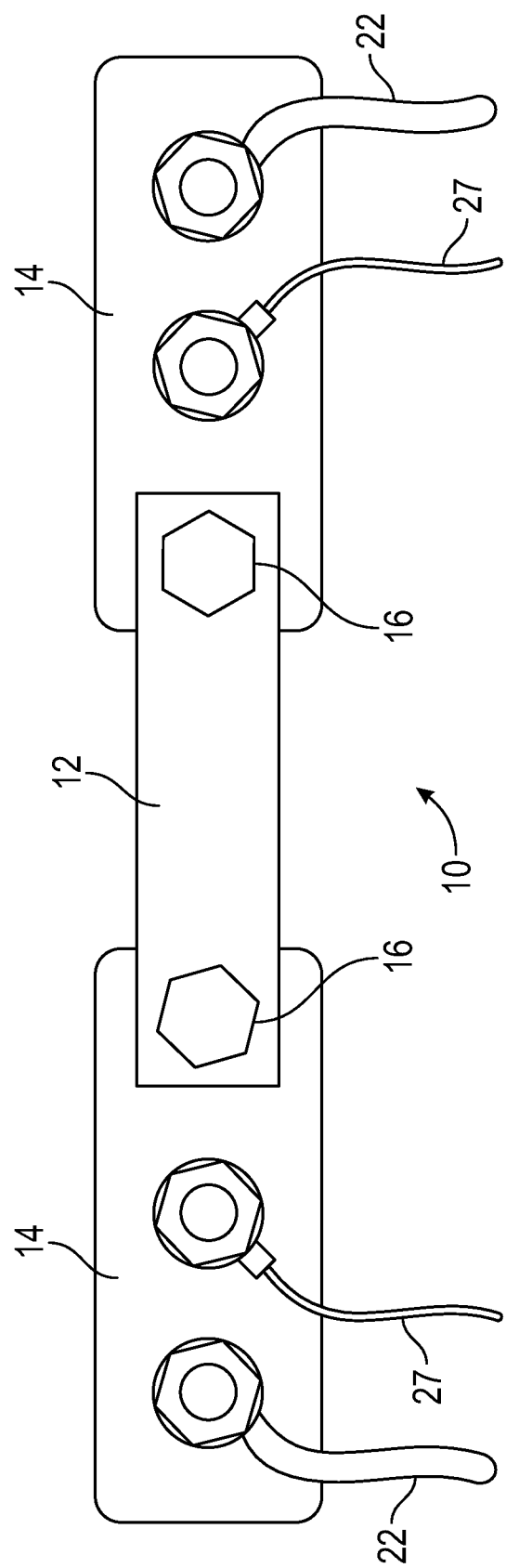
FIG. 2 is a plan view of the current shunt of FIG. 1.

A current shunt, generally designated 10, such as for use as a current sensor to sense a level of current flowing in a circuit, is illustrated in FIGS. 1 and 2. The current sensor may be incorporated into a battery management system (BMS) 11, discussed below in conjunction with FIG. 3.

Referring to FIGS. 1 and 2, the current shunt 10 may be formed of one, or preferably more, strips, or leaves, 12 of an electrically conductive material, preferably nickel. Nickel is corrosion resistant, relatively inexpensive and provides a satisfactory temperature/resistance relationship. The nickel may be 200 Series nickel. Alternatively the leaves 12 may be formed of stainless steel, titanium zinc, or the like.

Combinations of different materials may be used for the leaves 12, such as having one made of nickel and one made of zinc, so as to adjust for temperature, cost, and the like.

The leaves 12 may be arranged in parallel as a set, or stack. The leaves 12 may be spaced from one another, or in engagement.

The current shunt 10 may also include spaced conductive plates 14, coupled to opposing ends of the leaves 12. The conductive plates 14 may permit coupling the current shunt 10 in series in the BMS 11, discussed below. The conductive plates 14 may be copper, aluminum or some other sufficiently conductive material.

The leaves 12 may be removably secured together, and to the conductive plates 14, by a conventional bolt/nut combination 16, which may also include a conventional washer and lock washer (not shown). Instead of nuts and bolts, PEM nuts or studs may be used to make some or all of the connections. Alternatively rivets may be used to make some or all of the connections, as well as other fastener methods, such as welding, clamping, pinning, and the like.

The resistance of a material such as nickel may vary inversely with the cross-sectional area of the material. The number of leaves 12, of a given cross-sectional area, to be utilized for a particular application may be determined based upon a peak level of current anticipated to flow through the current shunt 10. The conventional nut/bolt combination 16 may permit easy assembly of the stacked current shunt 10, to include a requisite quantity of the leaves 12 for a particular application.

To minimize cost, each of the leaves 12 may be formed of conventional nickel tab stock, which may be readily available and relatively inexpensive. The nickel tab stock may have a conventionally available thickness of 0.22 mm and width of 25.40 mm. The nickel tab stock may be cut to a length of about 44.5 mm. One of the leaves 12 of these dimensions may be used for every 62.5 Amps of expected peak current. For example eight of the leaves 12, arranged in parallel, may be utilized for a 500 Amp, peak current sensor with a resistance of 75 µohms, +/−5 µohms.

Figure 3:
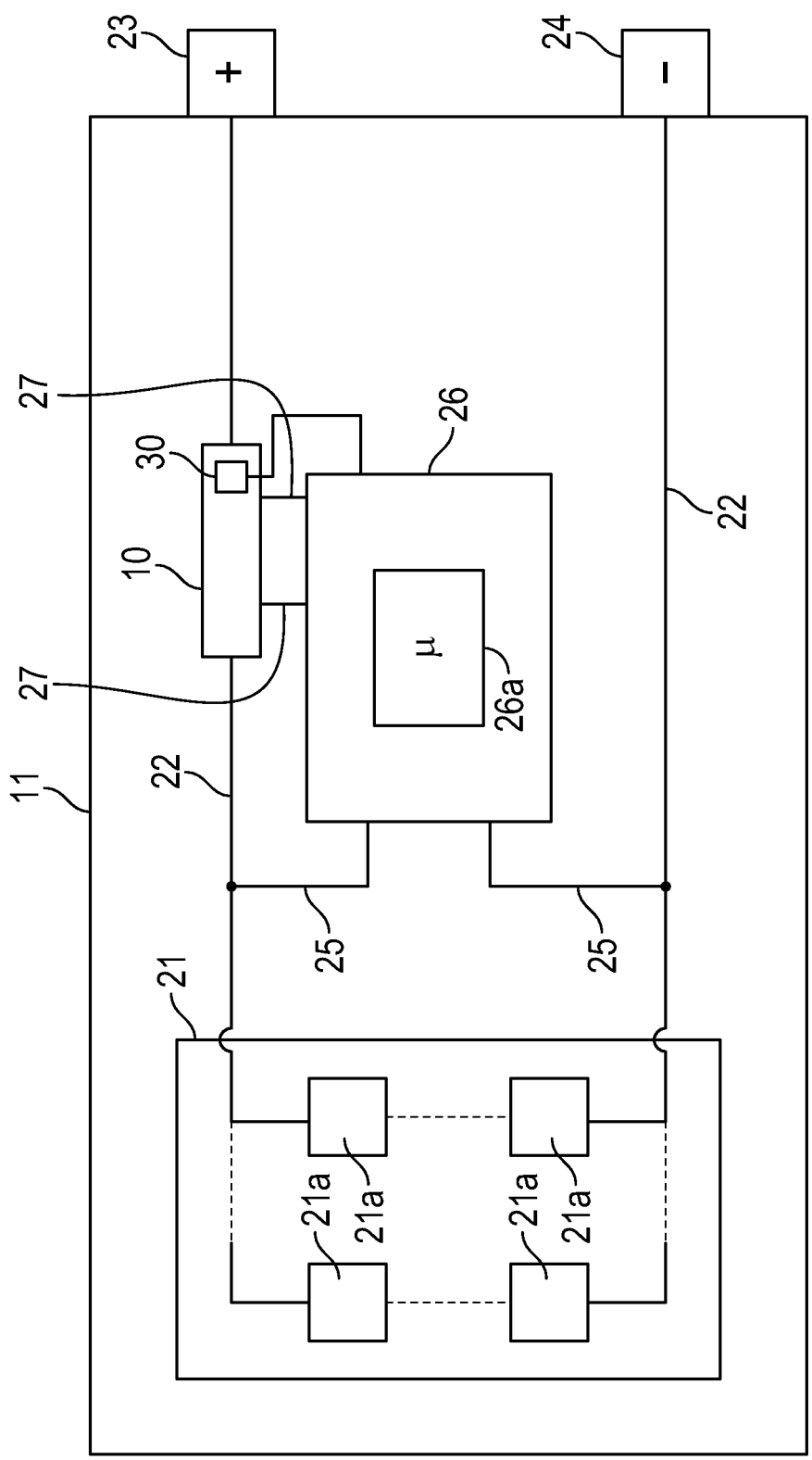
FIG. 3 is a block diagram of a battery management system including the current shunt of FIG. 1.

Referring to FIG. 3, the current shunt 10 is illustrated incorporated into the BMS 11. The BMS 11 may be electrically coupled to a conventional battery pack 21. The battery pack 21 may include one or more battery cells, such as conventional lithium-ion battery cells 21a. The lithium-ion battery cells 21a may have a nominal output voltage of 3.4 volts when fully charged. As is known, the battery cells 21a may be interconnected serially and/or in parallel such that the battery pack 21 may provide output power at a desired output voltage and capacity via conductors 22 to a conventional positive terminal 23 and negative terminal 24. The battery pack 21 may be a twelve-volt DC, deep cycle Marine Battery or similar, provided by K2 Energy Solutions, Inc., Henderson Nev., USA, assignee of the present application.

The current shunt 10 may include first mounting holes 14a (FIG. 1) to facilitate coupling of the current shunt 10 in series with the conductors 22, such as by conventional fasteners provided by Penn Engineering of Danboro, Pa., US.

The BMS 11 may include a control board 26. The current shunt 10 may be coupled to the control board 26 by sensing leads 27 to permit monitoring of the voltage across the current shunt 10. The current shunt 10 may include second mounting holes 14b (FIGS. 1 and 2) to facilitate coupling of the sensing leads 27 to the current shunt 10, such as by conventional fasteners provided by Penn Engineering of Danboro, Pa., US.

The battery pack 21 may also provide power through connections 25 to the control board 26. The control board 26 may include a conventional, programmed central processing unit (CPU) 26a, such as a conventional microprocessor and associated memory, to perform the current calculation. The microprocessor may be a STM32L051, provided by STMicroelectronics, Geneva, Switzerland.

The CPU 16a may periodically sample the voltage across the current shunt 14, to continuously calculate the current exiting from the battery pack 21 (during battery discharge) or entering into the battery pack 21 (during battery charge), such as to monitor the charging current of the battery pack 21, and thus monitor the state of charge of the battery pack 21.

To accommodate proper voltage drop and limit temperature rise, leaves of standard stock may be selected and then stamped, or cut, to a specific width and length. A key feature of this approach is to easily, and relatively inexpensively, control the proportion of length, width and thickness using standard stock material, while still properly measuring current flow. Compensation for potential inaccuracies, if necessary for the application, may be made by calibration of the current calculation software, discussed below with respect to FIG. 4.

Figure 4:
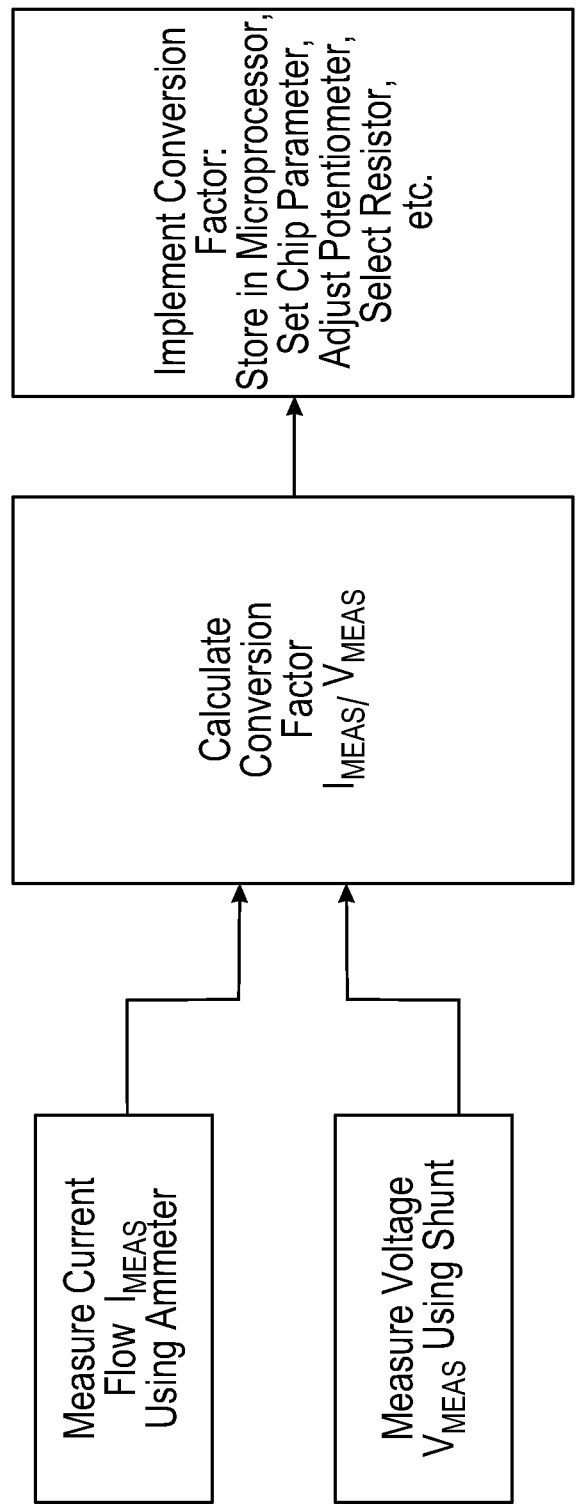
FIG. 4 is a flow diagram illustrating calibration of the battery management system of FIG. 3.
Figure 5A:
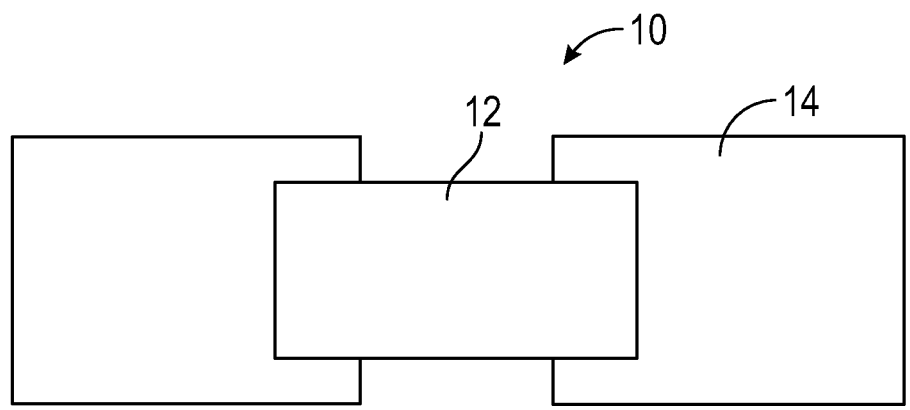
FIGS. 5a-5f illustrate alternative shapes of the current shunt of FIG. 1.
Figure 5B:
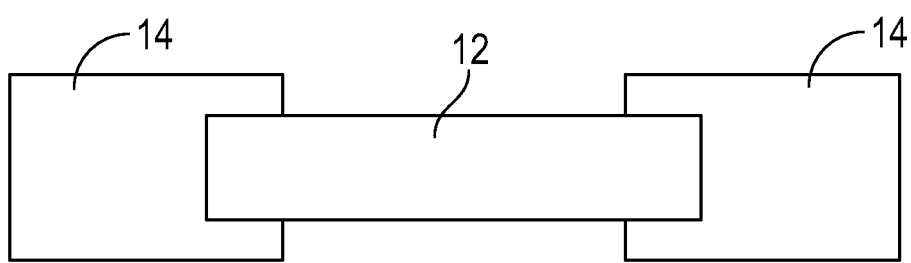
Figure 5C:
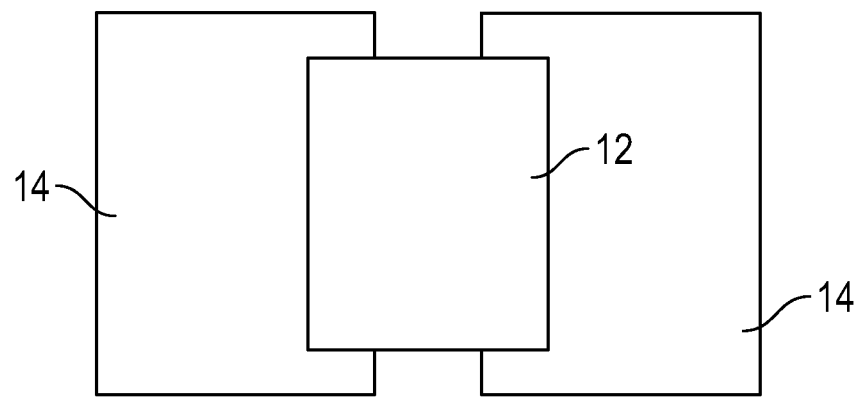
Figure 5D:
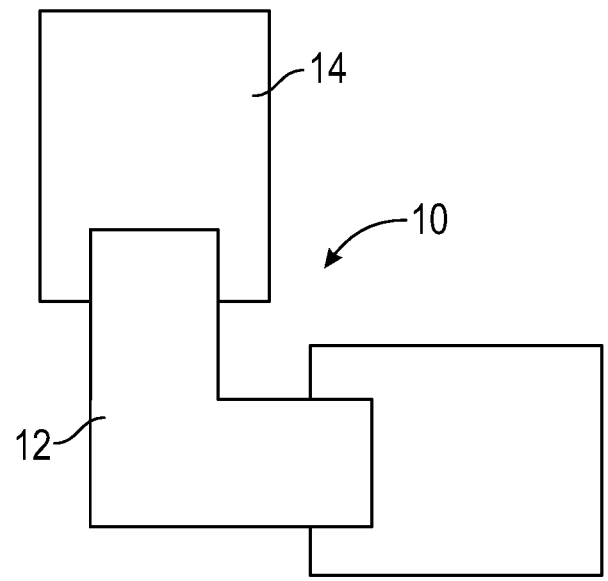
Figure 5E:
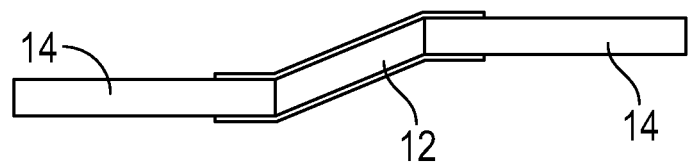
Figure 5F:
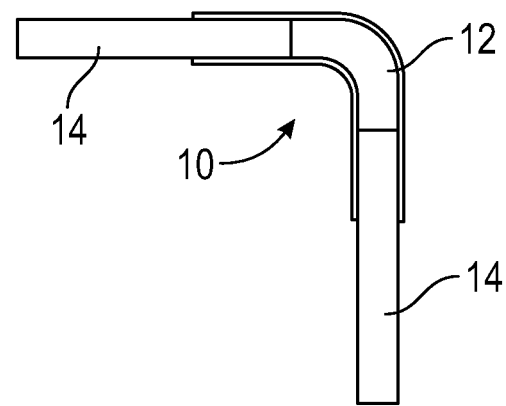

Referring to FIG. 4, the CPU 26a may be calibrated utilizing an ammeter (not shown) in line with the current shunt 14. As different levels of current, over the range of anticipated current levels, are caused to flow through the particular current shunt 10 (and the in-line ammeter), the voltage output across the current shunt 10 corresponding to the current measured by the ammeter may be measured, and the current levels and corresponding measured voltages may be stored in the CPU 26a.

For certain applications, the temperature coefficient of resistance of the nickel of the current shunt 10 is sufficiently constant over the anticipated temperature range. However in certain other applications requiring greater accuracy, a thermistor 30 (FIG. 3) may be provided to measure the effective temperature of the current shunt 10, such as either the ambient temperature around the current shunt 10, or the surface of the leaves 12. The CPU 26a may be further calibrated/programmed to account for such measured fluctuations in the effective temperature of the current shunt 10. In certain configurations, this may not require any additional components, as the particular battery management system may already include a thermistor, such as to turn off the associated battery pack 21 in the event the ambient temperature of the associated battery pack 21 is either too high or too low.

As Illustrated in FIGS. 5a-5f, the shape of the current shunt 10 may be modified, such as by stamping or bending, to accommodate mechanical constraints of particular applications, such as to accommodate dimensions of a housing (not shown) containing the current shunt 10. For example, the current shunt 10 may be elongated (FIG. 5b), shortened (FIG. 5c), angled (FIG. 5d), stepped (FIG. 5e), bent (FIG. 5f) or the like.

Figure 6:
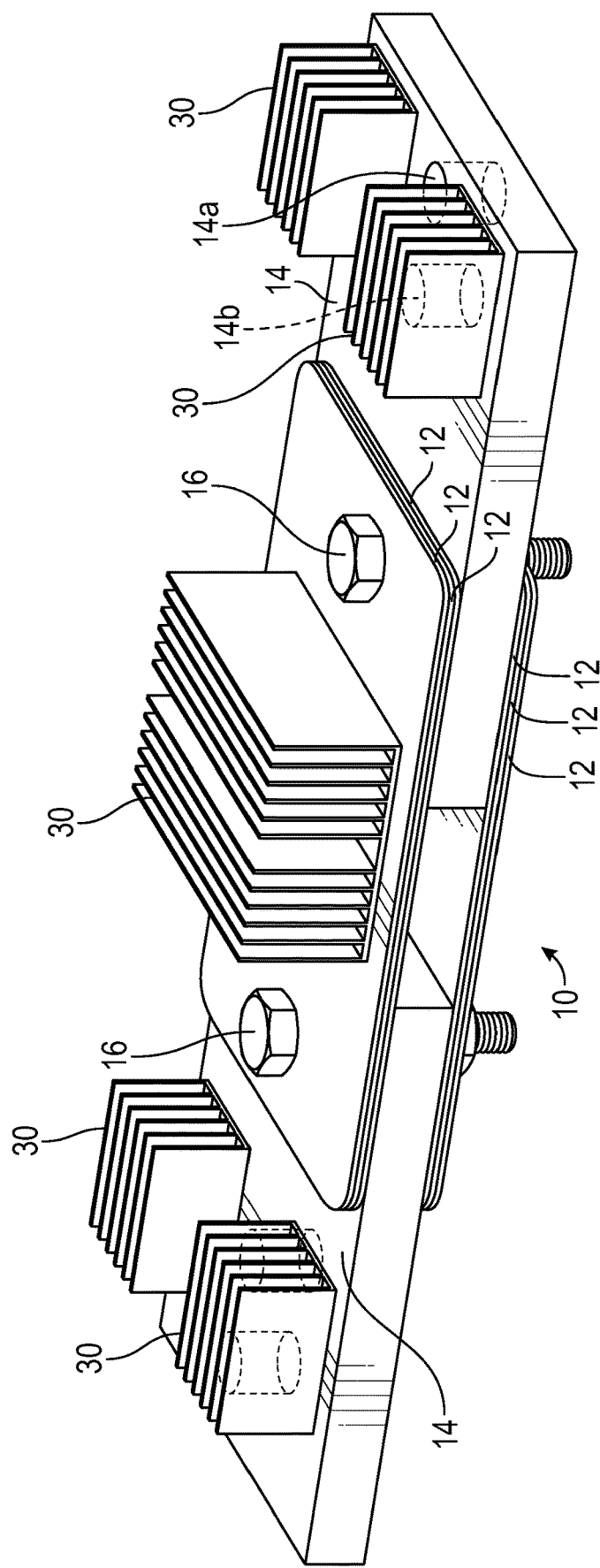
FIG. 6 is a perspective view of an alternative embodiment of the current shunt of FIG. 1, including heat sinks.

As illustrated in FIG. 6, according to an alternative embodiment, a heat sink 30 may be mounted on one or more of the leaves 12 and/or one or more of the conductive plates 14 to reduce temperature variations, such as due to variations in current.

Preferred embodiments of this invention have been described herein. It should be understood that the illustrated embodiments are exemplary only and should not be taken as limiting the scope of the invention.

What is claimed is:

1. For a lithium-ion battery pack adapted to provide electrical power to a load via a conductor, a current shunt adapted to be disposed in series with the conductor for measuring current through the conductor, the current shunt comprising:
   a plurality of parallel leaves of an electrically conductive material arranged as a set stacked in an engaging relationship;
   first and second conductive plates, each of the first and second conductive plates including a connector for facilitating electrical attachment of each of the respective conductive plates in series with the conductor; and
   first and second fasteners for respectively coupling the first and second conductive plates to opposing ends of the parallel leaves for facilitating assembly of a desired quantity of the parallel leaves to the first and second conductive plates.

2. The current shunt of claim 1 wherein the parallel leaves are formed of nickel.

3. The current shunt of claim 2 wherein the nickel leaves are formed of Series 200 nickel.

4. The current shunt of claim 2 wherein the nickel leaves are formed of nickel tab stock.

5. The current shunt of claim 1 wherein the leaves are formed of stainless steel.

6. The current shunt of claim 1 wherein the leaves are formed of titanium.

7. The current shunt of claim 1 including a heat sink disposed thereon.

8. The current shunt of claim 1 wherein the fasteners are removable.

9. The current shunt of claim 1 wherein the first and second fasteners each comprise a nut/bolt combination.

10. The current shunt of claim 1, wherein each of the nut/bolt combinations includes a lock washer.

11. A battery management system adapted to be coupled to a lithium-ion battery pack, the battery pack for providing electrical power, over a range of anticipated current levels, via a conductor to a load, the battery management system for determining current delivered between the battery pack and the load, the battery management system comprising:
 a current shunt adapted to be disposed in series with the conductor for measuring current flow through the conductor, the current shunt comprising a plurality of parallel leaves of an electrically conductive material, the parallel leaves arranged as a set stacked in an engaging relationship, the current shunt having a relationship between current flowing through the current shunt and voltage across the current shunt;
 a voltage measurement device for measuring the voltage across the current shunt; and
 a microprocessor having an input coupled to the voltage measurement device, the microprocessor specifically calibrated over the range of anticipated current levels, to the relationship between the current flowing through the current shunt and the voltage across the current shunt and programed to convert the measured voltage to a calculated current level.

12. The battery management system of claim 11, wherein the leaves are formed of nickel tab stock.

13. The battery management system of claim 11, including:
 a thermal measuring device adapted to measure the temperature of the current shunt; and
 wherein the microprocessor is coupled to an output of the thermal measuring device and is calibrated to a temperature-based relationship between the current flowing through the current shunt and the voltage across the current shunt.

14. The battery management system of claim 11, including a heat sink disposed on the current shunt.

15. A battery system comprising:
 a lithium ion battery pack for providing current at a voltage to a load; and
 a battery management system including a current shunt electrically disposed between the battery and the load, the current shunt for measuring the current provided to the load, wherein:
 the current shunt comprises a plurality of parallel leaves of nickel arranged as a set stacked in an engaging relationship, first and second conductive plates, each of the first and second conductive plates including a connector for facilitating electrical attachment of each of the respective conductive plates in series with the conductor, and first and second fasteners for respectively coupling the first and second conductive plates to opposing ends of the parallel leaves for facilitating assembly of a desired quantity of the parallel leaves to the first and second conductive plates; and
 a heat sink is disposed on the current shunt.

16. The battery system of claim 15, wherein the battery system is disposed in a housing and the current shunt is shaped to accommodate dimensions of the housing.

17. The battery system of claim 15 including:
 a temperature-sensing device adapted to measure an effective temperature of the current shunt; and wherein the battery management system includes a central processing unit coupled to the temperature-sensing device, wherein the central processing unit is specifically calibrated to determine a current level in response to the sensed effective temperature of the current shunt.

18. The battery system of claim 15 wherein;
 the nickel leaves are formed of nickel tab stock.

* * * * *